United States Patent
Ehberger et al.

(10) Patent No.: US 11,810,753 B2
(45) Date of Patent: Nov. 7, 2023

(54) METHODS OF DETERMINING ABERRATIONS OF A CHARGED PARTICLE BEAM, AND CHARGED PARTICLE BEAM SYSTEM

(71) Applicant: ICT Integrated Circuit Testing Gesellschaft für Halbleiterprüftechnik mbH, Heimstetten (DE)

(72) Inventors: Dominik Ehberger, Ebersberg (DE); John Breuer, Munich (DE); Matthias Firnkes, Walpertskirchen (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 168 days.

(21) Appl. No.: 17/500,842

(22) Filed: Oct. 13, 2021

(65) Prior Publication Data

US 2023/0113857 A1 Apr. 13, 2023

(51) Int. Cl.
*H01J 37/244* (2006.01)
*H01J 37/22* (2006.01)
(Continued)

(52) U.S. Cl.
CPC ............ *H01J 37/244* (2013.01); *G06T 7/0002* (2013.01); *H01J 37/153* (2013.01);
(Continued)

(58) Field of Classification Search
CPC ...... H01J 37/244; G06T 7/0002; H01J 37/153;
(Continued)

(56) References Cited

U.S. PATENT DOCUMENTS

| 7,714,286 B2* | 5/2010 | Nakano et al. ........ H01J 37/153 250/310 |
| 9,136,089 B2* | 9/2015 | Wang ..................... H01J 37/28 |

(Continued)

FOREIGN PATENT DOCUMENTS

| EP | 1 544 894 A2 | 6/2005 |
| GB | 2 305 324 A | 4/1997 |

(Continued)

OTHER PUBLICATIONS

Copy of International Search Report and Written Opinion for Application No. PCT/EP2022/073948, mailed Dec. 21, 2022, 16 pages.

(Continued)

*Primary Examiner* — David A Vanore
(74) *Attorney, Agent, or Firm* — Kilpatrick Townsend & Stockton LLP

(57) ABSTRACT

A method of determining aberrations of a charged particle beam (11) focused by a focusing lens (120) toward a sample (10) in a charged particle beam system is described. The method includes: (a) taking one or more images of the sample at one or more defocus settings to provide one or more taken images ($h_{1...N}$); (b) simulating one or more images of the sample taken at the one or more defocus settings based on a set of beam aberration coefficients ($^iC$) and a focus image of the sample to provide one or more simulated images; (c) comparing the one or more taken images and the one or more simulated images for determining a magnitude (Ri) of a difference therebetween; and (d) varying the set of beam aberration coefficients ($^iC$) to provide an updated set of beam aberration coefficients ($^{i+1}C$) and repeating (b) and (c) using the updated set of beam aberration coefficients ($^{i+1}C$) in an iterative process for minimizing said magnitude ($R_i$). Alternatively, in (b), one or more beam cross sections may be simulated, and, in (c) the simu- (Continued)

lated beam cross sections may be compared with one or more retrieved beam cross sections retrieved from the one or more taken images for determining a magnitude ($R_i$) of a difference therebetween. Further, a charged particle beam system for imaging and/or inspecting a sample that is configured for any of such methods is provided.

21 Claims, 4 Drawing Sheets

(51) Int. Cl.
H01J 37/153 (2006.01)
G06T 7/00 (2017.01)
H01J 37/10 (2006.01)

(52) U.S. Cl.
CPC ..... *H01J 37/222* (2013.01); *G06T 2207/10061* (2013.01); *G06T 2207/10148* (2013.01); *H01J 37/10* (2013.01); *H01J 2237/24578* (2013.01)

(58) Field of Classification Search
CPC .......... H01J 37/222; G06T 2207/10061; G06T 2207/10148; H01J 37/10; H01J 2237/24578

See application file for complete search history.

(56) References Cited

U.S. PATENT DOCUMENTS

| 9,666,405 | B1* | 5/2017 | Lanio et al. | H01J 37/244 |
| 11,094,501 | B2* | 8/2021 | Firnkes et al. | H01J 37/023 |
| 11,380,513 | B2* | 7/2022 | Kubota | H01J 37/21 |
| 2003/0001102 | A1* | 1/2003 | Zach | H01J 37/153 |
| | | | | 250/311 |
| 2015/0170876 | A1* | 6/2015 | Janssen et al. | H01J 37/28 |
| | | | | 250/311 |
| 2016/0254118 | A1* | 9/2016 | Kohno | H01J 37/222 |
| | | | | 250/307 |
| 2019/0122854 | A1* | 4/2019 | Zotta et al. | H01J 37/02 |
| 2021/0110996 | A1* | 4/2021 | Rhinow et al. | H01J 37/304 |
| 2021/0151284 | A1* | 5/2021 | Firnkes et al. | H01J 37/023 |

FOREIGN PATENT DOCUMENTS

WO 2021/078445 A1 4/2021

OTHER PUBLICATIONS

Copy of International Search Report and Written Opinion for Application No. PCT/EP2022/073953, mailed Dec. 21, 2022, 14 pages.

Reimer, L., "Scanning Electron Microscopy", Physics of Image Formation and Microanalysis, Section 2.4.2 Depth of Focus, Optical Sciences, Second Edition, Springer, Jan. 1, 1998, 4 pages.

* cited by examiner

METHODS OF DETERMINING ABERRATIONS OF A CHARGED PARTICLE BEAM, AND CHARGED PARTICLE BEAM SYSTEM

TECHNICAL FIELD

Embodiments described herein relate to methods of determining aberrations of a charged particle beam in a charged particle beam system, for example in an electron microscope, particularly in a scanning electron microscope (SEM). Specifically, actual values of beam aberration coefficients can be determined, facilitating the correction of the beam aberrations and improving the resolution. More specifically, embodiments described herein relate to methods of determining beam aberration coefficients of a charged particle beam focused by a focusing lens toward a sample in a charged particle beam system, which facilitates the provision of an aberration-corrected charged particle beam. Embodiments further relate to charged particle beam systems for inspecting and/or imaging a sample that is configured for any of the methods described herein.

BACKGROUND

Modern semiconductor technology has created a high demand for structuring and probing specimens in the nanometer or even in the sub-nanometer scale. Micrometer and nanometer-scale process control, inspection or structuring, is often done with charged particle beams, e.g. electron beams, which are generated, shaped, deflected and focused in charged particle beam systems, such as electron microscopes or electron beam pattern generators. For inspection purposes, charged particle beams offer a superior spatial resolution compared to, e.g., photon beams.

Inspection apparatuses using charged particle beams such as scanning electron microscopes (SEM) have many functions in a plurality of industrial fields, including, but not limited to, inspection of electronic circuits, exposure systems for lithography, detecting systems, defect inspection tools, and testing systems for integrated circuits. In such particle beam systems, fine beam probes with a high current density can be used. For instance, in the case of an SEM, the primary electron beam generates signal particles like secondary electrons (SE) and/or backscattered electrons (BSE) that can be used to image and/or inspect a sample.

Reliably inspecting and/or imaging samples with a charged particle beam system at a good resolution is, however, challenging because the charged particle beam typically suffers from beam aberrations that limit the obtainable resolution. In typical charged particle beam systems, aberration correctors are provided for at least partially compensating aberrations of the charged particle beam, such as spherical aberrations, astigmatism, and/or chromatic aberrations. An aberration-corrected charged particle beam can provide a smaller probe focus and hence a better resolution as compared to an uncorrected beam. However, it is challenging to appropriately adjust the settings of aberration correctors, which may have a large number of controls, such as to correct the beam aberrations satisfactorily, the reason being that the beam aberration that is present in the system is generally unknown.

In view of the above, it would be beneficial to provide methods of accurately and reliably determining aberrations of a charged particle beam focused by a focusing lens in a charged particle beam system, in particular for determining the actual values of beam aberration coefficients, i.e. the beam aberration coefficients in absolute values. Further, it would be beneficial to provide a charged particle beam system for inspecting and/or imaging a sample that is configured for being operated in accordance with any of the methods described herein.

SUMMARY

In light of the above, methods of determining beam aberrations of a charged particle beam and charged particle beam systems configured to determine beam aberrations of a charged particle beam are provided according to the independent claims.

According to a first aspect, a method of determining aberrations of a charged particle beam focused by a focusing lens toward a sample in a charged particle beam system is provided. The method includes: (a) taking one or more images of the sample at one or more defocus settings to provide one or more taken images; (b) simulating one or more images of the sample taken at the one or more defocus settings based on a set of beam aberration coefficients and a focus image of the sample to provide one or more simulated images; (c) comparing the one or more taken images and the one or more simulated images for determining a magnitude of a difference therebetween; and (d) varying the set of beam aberration coefficients to provide an updated set of beam aberration coefficients and repeating (b) and (c) using the updated set of beam aberration coefficients in an iterative process for minimizing said magnitude.

According to a second aspect, a method of determining aberrations of a charged particle beam focused by a focusing lens toward a sample in a charged particle beam system is provided. The method includes: (a) taking one or more images of the sample at one or more defocus settings to provide one or more taken images, and retrieving one or more retrieved beam cross sections from the one or more taken images; (b) simulating one or more beam cross sections at the one or more defocus settings based on a set of beam aberration coefficients to provide one or more simulated beam cross sections; (c) comparing the one or more retrieved beam cross sections and the one or more simulated beam cross sections for determining a magnitude of a difference therebetween; and (d) varying the set of beam aberration coefficients to provide an updated set of beam aberration coefficients and repeating (b) and (c) using the updated set of beam aberration coefficients in an iterative process for minimizing said magnitude.

In some embodiments, the one or more defocus settings include one or more defocus distances, and (a) includes taking the one or more images of the sample when the sample is arranged at the one or more defocus distances from a respective beam focus of the charged particle beam. Alternatively or additionally, the one or more defocus settings include one or more beam landing energies of the charged particle beam varied from a focus beam landing energy, and (a) includes taking the one or more images of the sample at the one or more beam landing energies.

The methods according to the first and second aspects both rely on the comparison of images taken out-of-focus, or beam cross sections retrieved therefrom, with respective simulated out-of-focus images, or respective simulated out-of-focus beam cross sections, simulated based on a set of beam aberration coefficients. An initial set of beam aberration coefficients is varied in an iterative process with the objective of providing simulated out-of-focus images, or simulated out-of-focus beam cross sections, that come close to the actually taken images or that come close to the beam cross section retrieved therefrom. The respective set of beam aberration coefficients can then be considered to essentially correspond to the beam aberration coefficients that are actually present in the system. Accordingly, the actual values of the beam aberration coefficients can be determined quantitatively, and the charged particle beam can be corrected accordingly.

According to a third aspect, a charged particle beam system for imaging and/or inspecting a sample with a charged particle beam, particularly with an electron beam, is provided. The charged particle beam system includes a charged particle source for emitting a charged particle beam propagating along an optical axis, a sample stage, a focusing lens for focusing the charged particle beam toward a sample placed on the sample stage, a charged particle detector for detecting signal particles emitted from the sample, and a processor and a memory storing instructions that, when executed by the processor, cause the system to perform any of the methods described herein.

In particular, a charged particle beam system for imaging and/or inspecting a sample with a charged particle beam, particularly with an electron beam, is provided. The charged particle beam system includes a charged particle source for emitting a charged particle beam propagating along an optical axis, a sample stage, a focusing lens for focusing the charged particle beam toward a sample placed on the sample stage, and a charged particle detector for detecting signal particles emitted from the sample. The system further includes a processor and a memory storing instructions that, when executed by the processor, cause the system (×1) to simulate one or more images of the sample at one or more defocus settings based on a set of beam aberration coefficients and a focus image of the sample, to provide one or more simulated images; or to simulate one or more beam cross sections at one or more defocus settings based on a set of beam aberration coefficients, to provide one or more simulated beam cross sections; (×2) to compare one or more taken images of the sample taken at the one or more defocus settings and the one or more simulated images for determining a magnitude of a difference therebetween; or to compare one or more retrieved beam cross sections retrieved from one or more taken images of the sample taken at the one or more defocus settings and the one or more simulated beam cross sections for determining a magnitude of a difference therebetween; and (×3) to vary the set of beam aberration coefficients to provide an updated set of beam aberration coefficients, and to use the updated set of beam aberration coefficients in a subsequent iteration of (×1) and (×2) for minimizing said magnitude.

Embodiments are also directed at apparatuses for carrying out the disclosed methods and include apparatus parts for performing the individual method actions. The method may be performed by way of hardware parts, a computer programmed by appropriate software, by any combination of the two or in any other manner. Furthermore, embodiments are also directed at methods of operating the described apparatuses.

Further advantages, features, aspects and details that can be combined with embodiments described herein are evident from the dependent claims, the description and the drawings.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to one or more embodiments and are described in the following.

DETAILED DESCRIPTION

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Figure 1:
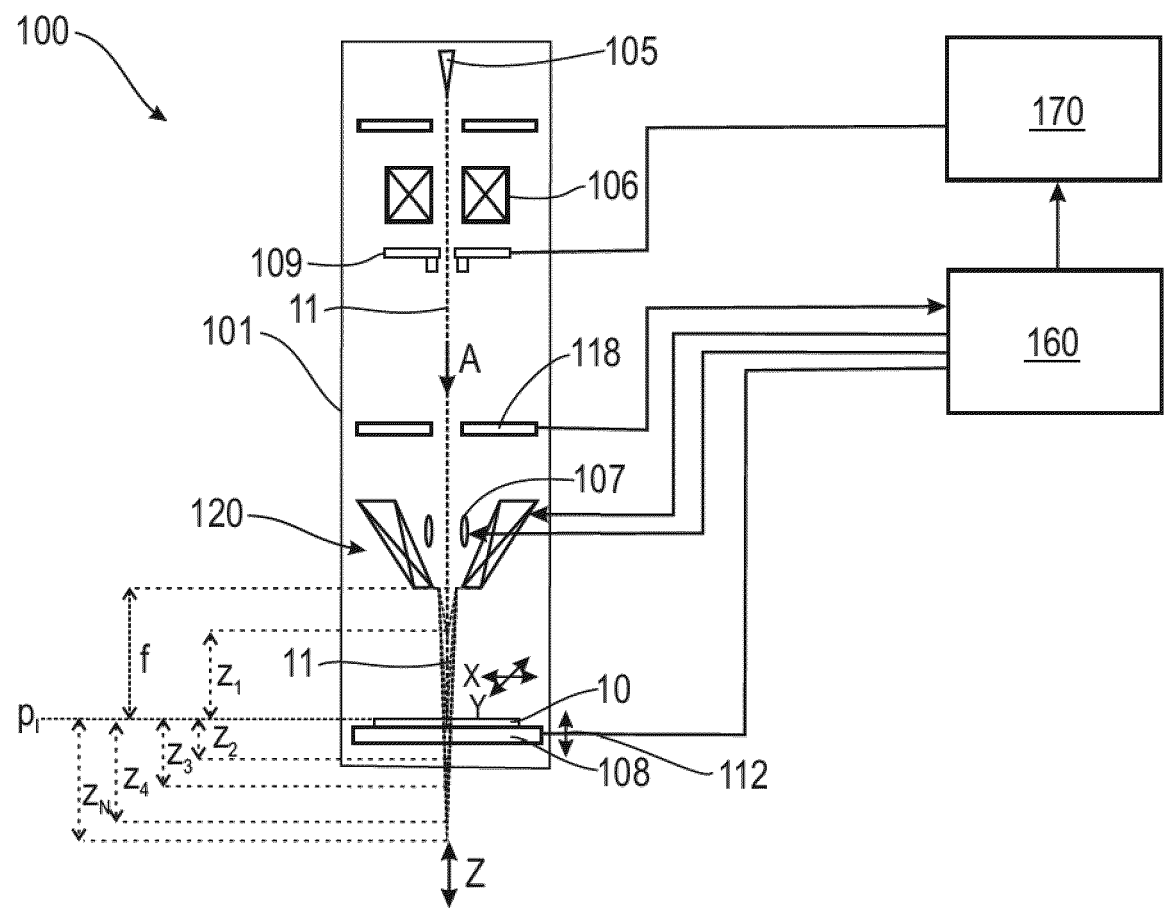
FIG. 1 shows a schematic view of a charged particle beam system according to embodiments described herein that is adapted for being operated according to any of the methods described herein.

FIG. 1 is a schematic view of a charged particle beam system 100 for inspecting and/or imaging a sample 10 according to embodiments described herein. The charged particle beam system 100 includes a charged particle source 105, particularly an electron source, for emitting a charged particle beam 11, particularly an electron beam, propagating along an optical axis A. The charged particle beam system 100 further includes a sample stage 108, and a focusing lens 120, particularly an objective lens, for focusing the charged particle beam 11 on the sample 10 that is placed on the sample stage 108. The charged particle beam system 100 further includes a charged particle detector 118, particularly an electron detector, for detecting signal particles (e.g., secondary electrons and/or backscattered electrons) emitted from the sample 10. Further, an image generation unit 160 may be provided that generates one or more images of the sample 10 based on the charged particle signal received from the charged particle detector 118. The image generation unit 160 can forward the one or more images of the sample to a processing unit 170 that is configured to determine aberration coefficients therefrom in accordance with the methods described herein.

The sample stage 108 may be a movable stage. In particular, the sample stage 108 may be movable in the Z-direction, i.e., in the direction of the optical axis A, such that the distance between the focusing lens 120 and the sample stage 108 can be varied (see arrow 112 in FIG. 1). By moving the sample stage 108 in the Z-direction, the sample 10 can be moved to different defocus distances away from a focal plane $p_f$ of the focusing lens 120 such that out-of-focus images of the sample 10 can be taken by a respective stage movement, e.g. in predetermined increments of, e.g. 0.1 μm or more and/or 2 μm or less. In some embodiments, the sample stage 108 may also be movable in a plane perpendicular to the optical axis A (also referred to herein as the X-Y-plane). By moving the sample stage 108 in the X-Y-plane, a specified surface region of the sample 10 can be moved into an area below the focusing lens 120, such that the specified surface region can be imaged by focusing the charged particle beam 11 thereon.

The beam-optical components of the charged particle beam system 100 are typically placed in a vacuum chamber 101 that can be evacuated, such that the charged particle beam 11 can propagate along the optical axis A from the charged particle source 105 toward the sample stage 108 and hit the sample 10 under a sub-atmospheric pressure, e.g. a pressure below $10^{-3}$ mbar or a pressure below $10^{-5}$ mbar.

In some embodiments, the charged particle beam system 100 may be an electron microscope, particularly a scanning electron microscope. A scan deflector 107 may be provided for scanning the charged particle beam 11 over a surface of the sample 10 along a predetermined scanning pattern, e.g., in the X-direction and/or in the Y-direction.

In some embodiments, a condenser lens system 106 may be arranged downstream of the charged particle source 105, particularly for collimating the charged particle beam 11 propagating toward the focusing lens 120. In some embodiments, the focusing lens 120 is an objective lens configured to focus the charged particle beam 11 on the sample 10, particularly a magnetic objective lens, an electrostatic magnetic lens, or a combined magnetic-electrostatic lens.

One or more surface regions of the sample 10 can be inspected and/or imaged with the charged particle beam system 100. The term "sample" as used herein may relate to a substrate, e.g., with one or more layers or features formed thereon, a semiconductor wafer, a glass substrate, a web substrate, or another sample that is to be inspected. The sample can be inspected for one or more of (1) imaging a surface of the sample, (2) measuring dimensions of one or more features of the sample, e.g. in a lateral direction, i.e. in the X-Y-plane, (3) conducting critical dimension measurements and/or metrology, (4) detecting defects, and/or (5) investigating the quality of the sample.

For inspecting the sample 10 with the charged particle beam 11, the charged particle beam 11 is typically focused on a sample surface with the focusing lens 120. Secondary electrons and/or backscattered electrons (referred to as "signal electrons") are emitted from the sample when the charged particle beam 11 impinges on the sample surface. The signal electrons provide information about spatial characteristics and dimensions of features of the sample and can be detected with the charged particle detector 118. By scanning the charged particle beam 11 over the sample surface, e.g. with the scan deflectors 107, and detecting the signal electrons as a function of the generation position of the signal electrons, the sample surface or a portion thereof can be imaged, e.g., with the image generation unit 160 that may be configured to provide an image of the sample 10 based on the received signal electrons.

A small spot of the focused charged particle beam 11 on the sample surface increases the obtainable image resolution. Accordingly, the sample surface should be arranged in the focal plane $p_I$ of the focusing lens 120 during the inspection, in order to obtain a sharp in-focus image of the sample 10. A sharp image of the sample 10 taken in-focus is also referred to herein as a "focus image $h_I$", the subscript I designating "In focus". Similarly, the beam cross section of the charged particle beam 11 in the focal plane $p_I$ is referred to herein as a "focus beam cross section $g_I$", the subscript I designating "In focus".

Notably, an image can be mathematically presented in real space (= in the image domain, i.e. as a function of the spatial coordinates) or in Fourier space (= in the frequency domain, i.e. as a function of spatial frequency). An image in Fourier space can be calculated from an image in real space via a Fourier transformation (FT). Both above representations contain corresponding information of the image. As used herein, images in real space are designated with the small letter "$h_n$" and images in Fourier space are designated by the capital letter "$H_n$". For example, while "$h_I$" designates the focus image of the sample in real space, "$H_I$" designates the focus image of the sample in Fourier space, which is a Fourier transform of $h_I$. Similarly, beam cross sections in real space are designated herein with the small letter "$g_n$", and beam cross sections in Fourier space are designated herein by the capital letter "$G_n$". For example, while "$g_I$" designates the focus beam cross section of the charged particle beam in real space, "$G_I$" designates the focus beam cross section of the charged particle beam in Fourier space, which is a Fourier transform of $g_I$. Images and beam cross sections in real space can be Fourier transformed into Fourier space, and vice versa, via a fast Fourier transform (FFT) algorithm in some of the embodiments described herein.

Simulated images and simulated beam cross sections are designated herein with a tilde above the respective letter, such as ($\tilde{h}_{1...N}$) for simulated images and ($\tilde{g}_{1...N}$) for simulated beam cross sections. Actual images taken by the charged particle beam system and beam cross sections retrieved from actually taken images are designated herein without a tilde above the respective letter, such as ($h_{1...N}$) for taken images and ($g_{1...N}$) for beam cross sections retrieved therefrom.

In charged particle beam systems, beam aberrations typically lead to an enlarged or deformed beam cross section, which reduces the achievable resolution. For example, spherical aberrations in the system which are typically introduced by lenses lead to an enlarged focus beam cross section $g_I$ in the focal plane $p_I$, and astigmatism may lead to different foci for rays propagating in difference planes, which blurs the image.

Different types of beam aberrations may be present in a charged particle beam system and may need correction, such as, for example, (1) spherical aberration (quantitatively expressed by the beam aberration coefficient $C_{3,0}$ or $C_s$), (2) defocus (quantitatively expressed by the beam aberration coefficient $C_{1,0}$, also referred to herein as $C_{defocus}$), (3) astigmatism of the 1$^{st}$ order (quantitatively expressed by the beam aberration coefficient $C_{1,2}$, also referred to herein as $C_{ast, 2-fold}$), (4) astigmatism of the 2$^{nd}$ order (quantitatively expressed by the beam aberration coefficient $C_{2,3}$, also referred to herein as $C_{ast,3-fold}$), (5) astigmatism of the 3$^{rd}$ order (quantitatively expressed by the beam aberration coefficient $C_{3,4}$, also referred to herein as $C_{ast,4-fold}$), (6) coma (quantitatively expressed by the beam aberration coefficient $C_{2,1}$, also referred to herein as $C_{coma}$), (7) star aberration (quantitatively expressed by the beam aberration coefficient $C_{3,2}$, also referred to herein as $C_{star}$). Further, a plurality of chromatic aberrations may be present, depending on the energy spread of the charged particle beam and on the dispersion of the beam-optical components of the system, which can be quantitatively expressed by one or more chromatic aberration coefficients. A set of beam aberration coefficients $^iC$ may include two, three or more of the above beam aberration coefficients, for example $^iC = [^iC_s, \,^iC_{defocus}, \,^iC_{ast,2-fold}]$.

Beam aberrations can be corrected with aberration correctors, for example with electrostatic or magnetic multipole correctors. An aberration corrector 109 is schematically depicted in FIG. 1, but it is to be understood that the charged particle beam system may also include two or more aberration correctors that are not necessarily provided at one position along the optical axis A. For example, a stigmator including a quadrupole may be provided for correcting $C_{ast,\ 2\text{-}fold}$, and higher order multipoles may be provided for correcting $C_{ast,\ 3\text{-}fold}$ and/or $C_{ast,\ 4\text{-}fold}$. More complex correctors may be provided for compensating $C_s$. Various types of aberration correctors for correcting various beam aberrations are known.

It is challenging to adjust an aberration corrector such that one or more types of beam aberration are appropriately corrected, the reason being that the amount of beam aberration that is present in the system is generally unknown. It is possible to set one or more aberration correctors such that pre-calculated beam aberrations that are theoretically introduced by the beam-optical components of the system are compensated, but such an approach is typically not sufficiently accurate. Specifically, not all the sources of beam aberrations are known, in particular quantitatively. For example, beam aberrations may also be introduced by inaccuracies of the system, such as mechanical, magnetic or electrostatic inaccuracies, charge contamination, material inhomogeneities, fabrication imperfections, which are not initially known. Beam-optical components may include one or more of an objective lens, a collimator, a deflector, a scan deflector, a beam separator, a charged particle detector, and an aberration corrector.

Different methods can be used for estimating beam aberrations in a charged particle beam system, such that the beam aberrations can be appropriately corrected. Some methods rely on the visible inspection of the charged particle beam, e.g. in the far-field, which may give an indication of aberrations that are present in the system. Other methods rely on the analysis of taken images. Specifically, an image that is taken out of focus may yield information about the beam cross section (i.e., the probe shape) via respective calculations, and the probe shape can give information about specific types of beam aberrations. For example, astigmatic beams are typically non-rotationally symmetric. Known methods rely on the extraction of line profiles from the beam cross sections, and beam aberrations can be estimated from such line profiles.

However, such concepts allow only for relative estimates of aberrations, whereas no absolute values of aberration coefficients can be retrieved. "Absolute values" of beam aberration coefficients may be understood as the actual quantitative values of the beam aberration coefficients, such as $C_s$ expressed in [mm], which values directly allow an appropriate setting of the aberration correctors based on the determined absolute values of the beam aberration coefficients. Notably, previously known methods only enable relative estimates of beam aberrations that may vary from measurement to measurement and may depend on the choice of numerical parameters in the retrieval algorithm.

Methods described herein allow for the accurate and reliable determination of aberrations of a charged particle beam, particularly the determination of the quantitative values of a set of beam aberration coefficients that describes the beam aberrations that are present in the system. The charged particle beam system 100 described herein includes a processor and a memory (shown in FIG. 1 as a processing unit 170) storing instructions that, when executed by the processor, cause the system to perform any of the methods described herein. In some embodiments, the set of beam aberration coefficients determined by the processing unit 170 can then be directly forwarded to the aberration corrector 109, such that the aberration corrector can compensate one or more of the beam aberrations, and an aberration-compensated charged particle beam can be provided.

Figure 2:
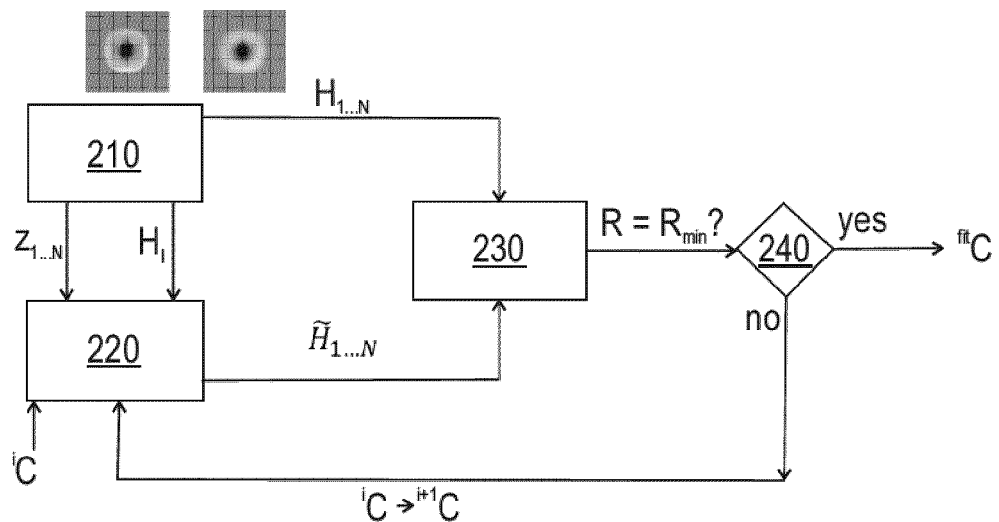
FIG. 2 shows a diagram illustrating a method of determining aberrations of a charged particle beam according to embodiments described herein.
Figure 3:
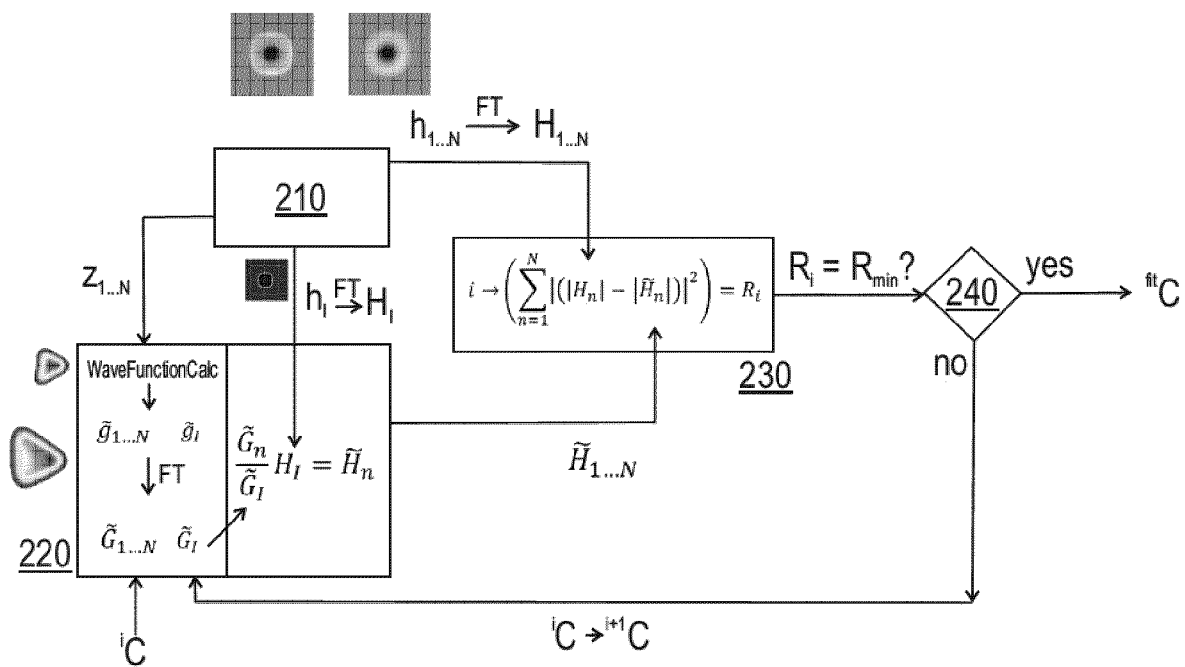
FIG. 3 shows a more detailed diagram illustrating a method as shown in FIG. 2.

FIG. 2 and FIG. 3 show diagrams illustrating one method of determining aberrations of a charged particle beam according to an embodiment described herein. The diagram of FIG. 3 shows optional further details as compared to the diagram of FIG. 2. The methods of FIG. 2 and FIG. 3 use an image-based aberration coefficient fitting routine, whereas the methods of FIG. 4 and FIG. 5 use a spot-based aberration coefficient fitting routine.

In box 210 of FIG. 2, one or more images of the sample 10 are taken at one or more defocus settings to provide one or more taken images ($h_{1...N}$), in particular by the image generation unit 160 (shown in FIG. 1). The one or more defocus settings may include one or more defocus distances ($Z_{1...N}$) between the sample 10 and a respective beam focus of the charged particle beam. A defocus distance is understood herein as the distance (>0) between the sample and the beam focus when an image is taken. Specifically, the one or more images of the sample may be taken, when the sample is arranged at one or more defocus distances ($Z_{1...N}$) from a respective beam focus of the charged particle beam (schematically depicted in FIG. 1), such that the one or more taken images ($h_{1...N}$) are out-of-focus images of the sample. Naturally, an increased defocus distance leads to an increased blurring of the respective taken image, because the probe size generally increases and the resolution generally decreases with the defocus distance.

In some embodiments, a plurality of two, three, six or more images may be taken at two, three, six or more different defocus distances between the sample and the respective beam focus. Specifically, at least one image of the sample may be taken at an overfocus distance, i.e. at a defocus setting in which the sample is arranged further away from the focusing lens 120 than the beam focus of the charged particle beam (see defocus distance $Z_1$ illustrated in FIG. 1). Further, at least one image of the sample may be taken at an underfocus distance, i.e. at a defocus setting in which the sample is arranged closer to the focusing lens 120 than the respective beam focus of the charged particle beam (see defocus distances $Z_{2...N}$ illustrated in FIG. 1). An image taken at the first defocus distance $Z_1$ is designated herein as a taken image $h_1$, and an image taken at the $n^{th}$ defocus distance $Z_n$ is designated herein as taken image $h_n$. A total of N images may be taken, designated as ($h_{1...N}$).

The defocus distance can be varied by varying a focusing strength of the focusing lens 120, e.g. in predetermined increments (as is schematically depicted in FIG. 1). Specifically, an increased focusing strength of the focusing lens shifts the respective beam focus and the focal plane relative to the sample toward the focusing lens, and a decreased focusing strength shifts the respective beam focus and the focal plane relative to the sample away from the focusing lens, such that the defocus distance is varied. Alternatively or additionally, the defocus distance can be varied by moving the sample stage 108, e.g., in predetermined increments, particularly in the Z-direction (along the optical axis A), in particular while maintaining a constant focal strength provided by the focusing lens 120.

In some embodiments, which can be combined with other embodiments described herein, the one or more defocus settings may include one or more beam landing energies ($E_{1...N}$) of the charged particle beam 11 varied from a focus beam landing energy. A focus beam landing energy $E_I$ can be understood as a beam landing energy which provides a beam focus on the sample, such that the sample is arranged in focus. A variation of the beam landing energy from the focus beam landing energy $E_I$ (for example, by varying the potential of the particle source (emitter) or of the sample (wafer bias)) may shift the beam focus away from the sample, such that a varied beam landing energy leads to a "defocus image" of the sample.

The one or more defocus settings may include one or more beam landing energies $(E_{1...N})$ varied from the focus beam landing energy $E_I$, particularly two, three, six or more different beam landing energies. Specifically, a plurality of images of the sample 10 can be taken at a plurality of different beam landing energies $(E_{1...N})$, such that the one or more taken images $(h_{1...N})$ include a plurality of energy defocus images of the sample.

In some embodiments, the one or more defocus settings may include one or more different defocus distances $(z_{1...N})$ of the sample and one or more different beam landing energies $(E_{1...N})$ of the charged particle beam. If images are not only taken at one or more varied defocus distances, but also at one or more varied defocus energies, this may facilitate the reliable and accurate determination not only of the "geometric" beam aberration coefficients, such as astigmatism and spherical aberration, but also of one or more "chromatic" aberration coefficients.

Returning to FIG. 2 and FIG. 3, in box 220, one or more images of the sample 10 are simulated to provide one or more simulated images $(\tilde{h}_{1...N})$. The simulation can be conducted by the processing unit 170 shown in FIG. 1. The images are simulated at the one or more defocus settings that are used in box 210 for taking the images. In other words, the defocus settings used in box 210 for taking the images are considered in box 220 for simulating the images. For example, if the one or more taken images $(h_{1...N})$ are taken at one or more defocus distances $(z_{1...N})$, the one or more defocus distances $(z_{1...N})$ can be forwarded to the processing unit or are otherwise known to the processing unit, and the one or more simulated images $(\tilde{h}_{1...N})$ are defocus images that look like images taken at said defocus distances.

The images in box 220 can be simulated for each defocus setting based on the focus image $(h_I)$ of the sample and based on a set of beam aberration coefficients $^iC$. The focus image $(h_I)$ may be generated by the image generation unit 160 at a focus setting of the charged particle beam system and may be forwarded to the processing unit 170, i.e. the focus image may be actually taken by the charged particle beam system at a focus setting. Alternatively, the focus image $h_I$ may be already known in advance to the processing unit 170, e.g. because a sample with a known design is used for the determination of the beam aberrations. As explained above, the focus image may be provided in real space $(h_I)$ or in Fourier space $(H_I)$.

An initial set of beam aberration coefficients $^1C$ may be used initially for the simulation in box 220. The initial set of beam aberration coefficients $^1C$ may be an initial estimation of the beam aberration coefficients, e.g., based on experience, based on an aberration estimation process known in the art, and/or based on knowledge of the beam-optical components of the system. Alternatively, some or all beam aberration coefficients may be set to zero in the initial set of beam aberration coefficients $^1C$.

If the one or more defocus settings include one or more defocus distances $(z_{1...N})$, the one or more simulated images include simulated images of the sample taken at the one or more defocus distances $(z_{1...N})$. Alternatively or additionally, if the one or more defocus settings include one or more beam landing energies $(E_{1...N})$, the one or more simulated images include simulated images of the sample taken at the one or more beam landing energies $(E_{1...N})$.

As is schematically depicted in FIG. 2 and in FIG. 3, the input data for the simulation in box 220 may include the defocus settings previously used for the taken images, the focus image $H_I$, and an initial or updated set of beam aberration coefficients $^iC$ / $^{i+1}C$.

In box 230, the one or more taken images $(h_{1...N})$ and the one or more simulated images $(\tilde{h}_{1...N})$ are compared for determining a magnitude $(Ri)$ of a difference between the one or more taken images $(h_{1...N})$ and the one or more simulated images $(\tilde{h}_{1...N})$. As is schematically depicted in FIG. 2 and FIG. 3, the one or more taken images $(h_{1...N})$ and the one or more simulated images $(\tilde{h}_{1...N})$ may be compared to each other in box 230 in Fourier space, i.e. by comparing $(H_{1...N})$ and $(\tilde{H}_{1...N})$. For that purpose, the one or more taken images may be Fourier transformed for the comparison, to provide the one or more taken images in Fourier space $(H_{I...N})$. A comparison in Fourier space may be advantageous because inaccuracies due to an incorrect superposition of a taken image and a respective simulated image for the comparison do not appear in Fourier space (when comparing (squared) absolute values of $(H_{I...N})$ and $(\tilde{H}_{1...N})$), since linear shifts in real space only appear as phase terms in Fourier space. Alternatively, even if not shown in the figures, it is also possible to compare the one or more taken images in real space $(h_{1...N})$ with the one or more simulated images in real space $(\tilde{h}_{1...N})$.

Comparing in box 230 may include calculating a difference value between each image of the one or more taken images $(H_n)$ and the corresponding simulated image $(\tilde{H}_n)$ of the one or more simulated images, and summarizing said difference values to obtain the magnitude $(R_i)$, in particular in Fourier space. In particular, in some embodiments, the magnitude $(Ri)$ may be calculated as follows from the one or more taken images in Fourier space $(H_{1...N})$ and the one or more simulated images in Fourier space $(\tilde{H}_{1...N})$ simulated based on the set of beam aberration coefficients $^iC$:

$$i \to \left( \sum_{n=1}^{N} \left( |H_n| - |\tilde{H}_n| \right)^2 \right) = R_i$$

If the initial set of beam aberration coefficients $^1C$ is used in the simulation, the magnitude $R_1$ is calculated. In subsequent iterations, updated sets of beam aberration coefficients $^{i+1}C$ are respectively used and $(R_{i+1})$ is calculated, with the objective to determine a set of beam aberration coefficients that leads to a minimized magnitude $(R_{min})$.

Notably, different types of beam aberrations are pronounced to different degrees at different defocus settings. For example, some beam aberrations may be better determinable close to the focal plane while other beam aberrations may be better determinable at a position away from the focal plane, and some beam aberrations, such as higher order astigmatisms, can be detected well by comparing one or more overfocus images with respective one or more underfocus images. Therefore, for reliably determining a set of several beam aberration coefficients, it is helpful to compare a plurality of taken images (e.g. six, eight, ten or more images, some taken at underfocus and some at overfocus) with a respective plurality of simulated images at respective defocus settings. By minimizing the summarized differences between the respective images, several beam aberration coefficients can be determined that come very close to the respective actual beam aberration coefficients present in the system, by the fitting routine described herein.

After calculating ($R_i$), the set of beam aberration coefficients $^iC$ is varied to provide an updated set of beam aberration coefficients $^{i+1}C$, and the simulation in box 220 and the comparison in box 230 are repeated using the updated set of beam aberration coefficients $^{i+1}C$ in an iterative process. Specifically, one or more updated simulated images are then calculated based on the updated set of beam aberration coefficients $^{i+1}C$ in box 220, and the one or more taken images ($h_{1...N}$) are compared with the one or more updated simulated images in box 230, with the objective of minimizing the magnitude (Ri) in an iterative simulation and comparison process.

In particular, the simulation in box 220, the comparison in box 230, and the variation of $^iC$ to provide $^{i+1}C$ may be repeated in an iterative process, until a minimized magnitude ($R_{min}$) of the difference between the one or more taken images and the one or more simulated images is obtained, and the respective updated set of beam aberration coefficients at the respective iteration constitutes an actual beam aberration $^{fit}C$. Specifically, as is schematically illustrated in box 240 of FIG. 2 and FIG. 3, after each iteration, it may be checked whether ($R_i = R_{min}$). If ($R_i = R_{min}$), the iterative process may be stopped, and $^iC$ may be considered as the actual beam aberration $^{fit}C$. Otherwise, the next iteration may follow.

In some implementations, the beam aberration coefficients of the set of beam aberration coefficients are varied subsequently and/or in parallel, until the minimized magnitude ($R_{min}$) as a function of all the beam aberration coefficients of the set of beam aberration coefficients is obtained. In particular, a multi-dimensional variation routine can be used for varying the beam aberration coefficients of the set of beam aberration coefficients, for retrieving the set of beam aberration coefficients that yields ($R_{min}$) in the respective comparison between the taken and the simulated images.

In some embodiments, which can be combined with other embodiments described herein, the actual beam aberration $^{fit}C$ may be corrected partially or entirely with one or more aberration correctors, particularly with one or more electrostatic and/or magnetic multipole correctors, to provide an aberration-corrected charged particle beam.

In some embodiments, which can be combined with other embodiments described herein, the set of beam aberration coefficients ($^iC$) may include two, three or more coefficients of the group consisting of $^iC_s$, $^iC_{defocus}$, $^iC_{astigmatism,\ 2\text{-fold}}$, $^1C_{astigmatism,\ 3\text{-fold}}$, $^iC_{astigimtism,\ 4\text{-fold}}$, $^iC_{star}$, and $^iC_{coma}$, and one, two or more chromatic aberration coefficients $^iC_c$. The methods described herein allow an accurate determination of geometric beam aberration coefficients, particularly by varying the defocus distance $z_n$ when taking and simulating the one or more defocus images. Further, the methods described herein allow an accurate determination of chromatic beam aberration coefficients, particularly by varying the beam landing energy $E_n$ when taking and simulating the one or more defocus images. Accordingly, all relevant beam aberration coefficients can be accurately determined, particularly quantitatively, by providing the absolute values of the respective beam aberration coefficients as a result of the iterative processes described herein.

In some embodiments, the simulation in box 220 may include a calculation of the beam cross section of the charged particle beam at each defocus setting of the one or more defocus settings based on the set of beam aberration coefficients $^iC$. A calculation of a beam cross section at a specific defocus setting can be conducted by a wave optical simulation, with the aberration coefficients as input parameters. The beam cross sections can be calculated in real space ($\tilde{g}_{1...N}$) and can then be Fourier transformed to provide the beam cross sections in Fourier space $\tilde{G}_{1...N}$, as is illustrated in box 220 of FIG. 3.

Thereafter, for each defocus setting, a respective simulated image in Fourier space ($\tilde{H}_n$) can be calculated from the focus image of the sample in Fourier space ($H_I$) and the simulated beam cross section in Fourier space ($\tilde{G}_n$), particularly based on a product of the beam cross section in Fourier space and the focus image in Fourier space ($\tilde{G}_n \cdot H_I$). If an image of a sample is taken at a defocus setting, the resulting out-of-focus image corresponds to a convolution of the focus image (i.e., the actual sample) with the out-of-focus beam cross section in real space. A convolution in real space corresponds to a product in Fourier space. Accordingly, a simulated image in Fourier space $\tilde{H}_n$ can be calculated based on the product ($\tilde{G}_n \cdot H_I$), Of course, the simulated images can also be calculated in real space based on a convolution of ($\tilde{g}_{1...N}$) and $h_I$, which is equivalent to the above product in Fourier space.

In some embodiments, the calculation of the simulated image in Fourier space ($\tilde{H}_n$) may further include a division of the above product ($\tilde{G}_n \cdot H_I$) by a focus beam cross section in Fourier space ($\tilde{G}_I$), as is schematically depicted in box 220 of FIG. 3.

The determination method described above and illustrated in FIG. 2 and FIG. 3 allows for obtaining absolute values of beam aberration coefficients of a charged particle beam in a charged particle beam system, particularly in a scanning electron microscope, directly from one or more SEM images taken at one or more defocus settings. Therein, different from other methods, a deconvolution of the one or more taken images to retrieve information about the respective beam cross sections from the one or more taken images is not required. Goodness-of-fit routines in the processing unit can provide a confidence level of the accuracy of the obtained aberration coefficients $^{fit}C$, which has not been possible previously.

An accurate knowledge of the beam aberrations in a charged particle beam system, particularly for imaging, defect review, metrology, e-beam inspection and/or critical dimensioning, is key to improve the performance of the system. The beam aberrations obtained by the methods described herein can be used, for example, (1) for reducing beam aberrations by respective aberration correctors, (2) as an empiric basis for the development of beam-optical components of future systems, (3) for ensuring reproducibility and matching, (4) for comparing the determined values to simulation.

Figure 4:
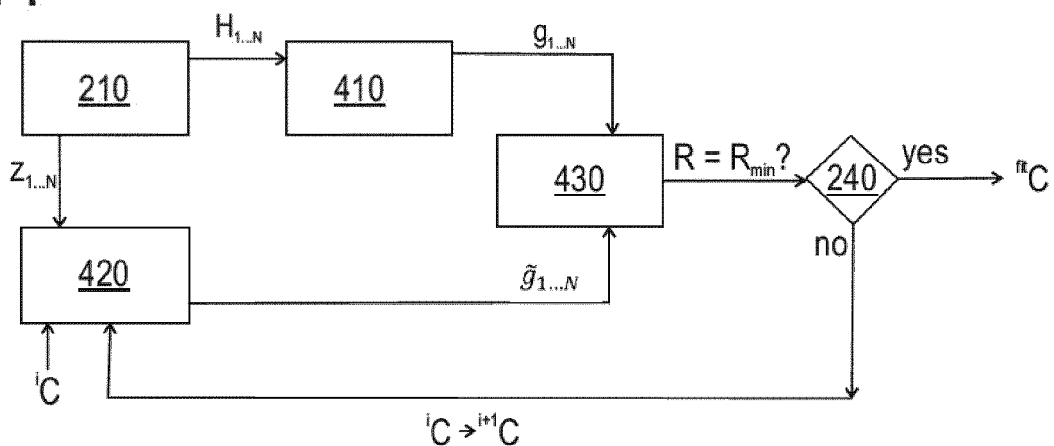
FIG. 4 shows a diagram illustrating a variant method of determining aberrations of a charged particle beam according to embodiments described herein.
Figure 5:
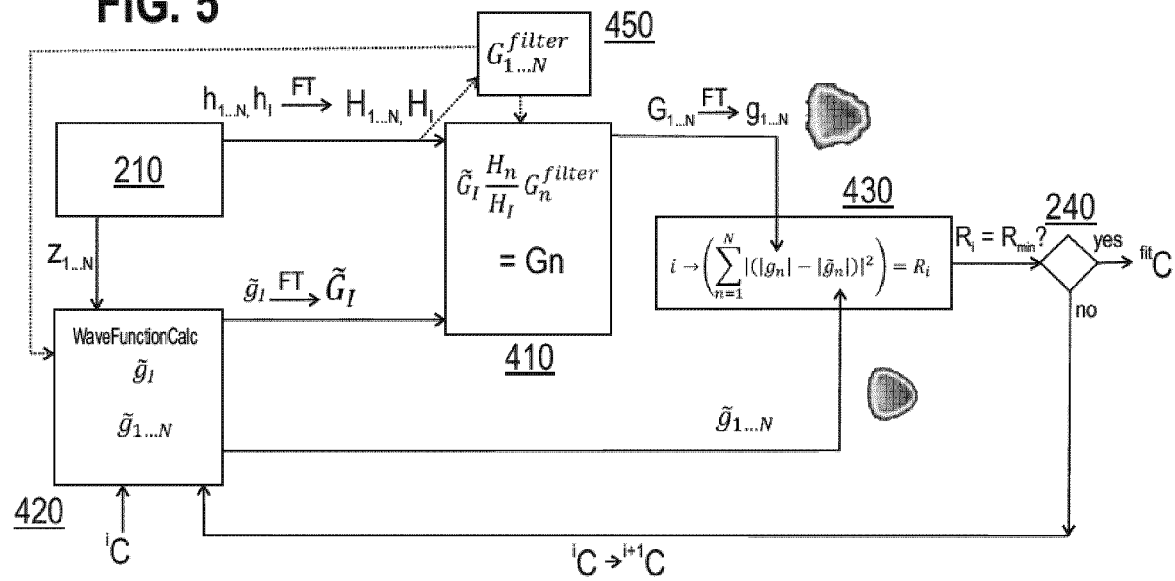
FIG. 5 shows a more detailed diagram illustrating the variant method shown in FIG. 4.

FIG. 4 and FIG. 5 show diagrams illustrating a variant method of determining aberrations of a charged particle beam according to an embodiment described herein. The diagram of FIG. 5 shows optional further details as compared to the diagram of FIG. 4. Different from the method illustrated in FIG. 2 and FIG. 3, the variant method uses a spot-based aberration coefficient fitting routine instead of an image-based aberration coefficient fitting routine. Apart from said difference, the variant method may include any of the features of the above method, as will be readily understood by the skilled person, and the respective features and explanations are not repeated in the following.

In box 210, one or more images of the sample 10 are taken at the one or more defocus settings to provide one or more taken images ($h_{1...N}$). As already explained above with respect to FIG. 2 and FIG. 3, the one or more defocus settings may include one or more defocus distances ($Z_{1...N}$) of the sample from a respective beam focus of the charged particle beam. Alternatively or additionally, the one or more defocus settings may include one or more beam landing energies ($E_{1...N}$) of the charged particle beam varied from a focus beam landing energy ($E_f$). In particular, a plurality of two, three, six or more images of the sample are taken at two, three, six or more different defocus settings, particularly at least one or more images at an underfocus setting and at least one or more images at an overfocus setting. The defocus distance may be varied by varying the focusing strength of the focusing lens or by moving the sample stage relative to a constant focal plane of the focusing lens.

Different from the method depicted in FIG. 2 and FIG. 3, in box 410, one or more retrieved beam cross sections ($g_{1...N}$) are retrieved from the one or more taken images ($h_{1...N}$). Out-of-focus beam profiles can be extracted from out-of-focus images via several different profile extraction methods. One exemplary probe profile extraction method is explained in the following.

The retrieval of the one or more retrieved beam cross sections ($g_{1...N}$) from the one or more taken images ($h_{1...N}$) may be based on a deconvolution in real space which is equivalent to a division in Fourier space. As is depicted in box 410 of FIG. 5, retrieving the one or more retrieved beam cross sections ($g_{1...N}$) from the one or more taken images ($h_{1...N}$) may specifically include Fourier transforming the one or more taken images in real space ($h_{1...N}$) to provide the one or more taken images in Fourier space ($H_{1...N}$), and dividing the one or more taken images in Fourier space ($H_{1...N}$) by a focus image of the sample in Fourier space ($H_f$). The above beam profile extraction method is based on the fact that, in Fourier space, dividing a taken defocus image ($H_n$) of a sample by the focus image ($H_f$) of the sample removes the structure of the sample, such that said division yields the pure beam profile, i.e. the beam cross section without sample information. The retrieved beam cross section in Fourier space ($G_n$) may be inversely Fourier transformed for obtaining the retrieved beam cross section in real space ($g_n$).

As is further illustrated in box 410 of FIG. 5, retrieving the one or more retrieved beam cross sections ($g_{1...N}$) from the one or more taken images ($h_{1...N}$) may optionally include the application of a filter, in particular a multiplication with an adaptive filter term $G_{1...N}^{Filter}$ if the retrieval is done in Fourier space (as illustrated in FIG. 5), or a convolution with an adaptive filter term, if the retrieval is done in real space. The adaptive filter term $G_{1...N}^{Filter}$ can be provided by an adaptive filter unit 450 that may receive the taken images as an input information. An adaptive filter term may be provided individually for each of the taken images ($H_{1...N}$) by the adaptive filter unit 450. Without the adaptive filter term $G_{1...N}^{Filter}$, close-to-zero values of the focus image $H_f$ in the denominator of the above division may lead to an overly strong weight of noise in the image. The adaptive filter term $G_{1...N}^{Filter}$ reduces or avoids such unwanted effects of noise in the focus image $H_f$ in the calculation of the focus beam cross sections $G_{1...N}$, and a respective filter term may be determined in the adaptive filter unit 450 for each of the taken images individually. The filter term $G_{1...N}^{Filter}$ may also be applied to the respective simulated beam cross section ($\tilde{g}_{1...N}$), in order to allow a better comparison between the retrieved beam cross sections and the respective simulated beam cross sections in box 430. The application of the filter term $G_{1...N}^{Filter}$ both for retrieving the beam cross sections in box 410 and for simulating the beam cross sections in box 420 is illustrated in dashed lines in FIG. 5. Alternatively or additionally to the application of the adaptive filter term, retrieving the one or more retrieved beam cross sections ($g_{1...N}$) from the one or more taken images ($h_{1...N}$) may include a multiplication with a focus beam cross section in Fourier space ($\tilde{G}_f$), as is illustrated in box 410 of FIG. 5.

In box 420, one or more beam cross sections at the one or more defocus settings are simulated to provide one or more simulated beam cross sections ($\tilde{g}_{1...N}$). The simulation can be conducted by the processing unit 170 of FIG. 1. The beam cross sections are simulated at the one or more defocus settings used in box 210. In other words, the defocus settings used in box 210 for taking the images are considered in box 220 for simulating the beam cross sections. For example, if the one or more taken images ($h_{1...N}$) are taken at one or more defocus distances ($z_{1...N}$), the one or more defocus distances ($z_{1...N}$) can be forwarded to the processing unit, and the one or more simulated beam cross sections ($\tilde{g}_{1...N}$) are out-of-focus cross sections of the charged particle beam at said defocus distances.

Figure 6:
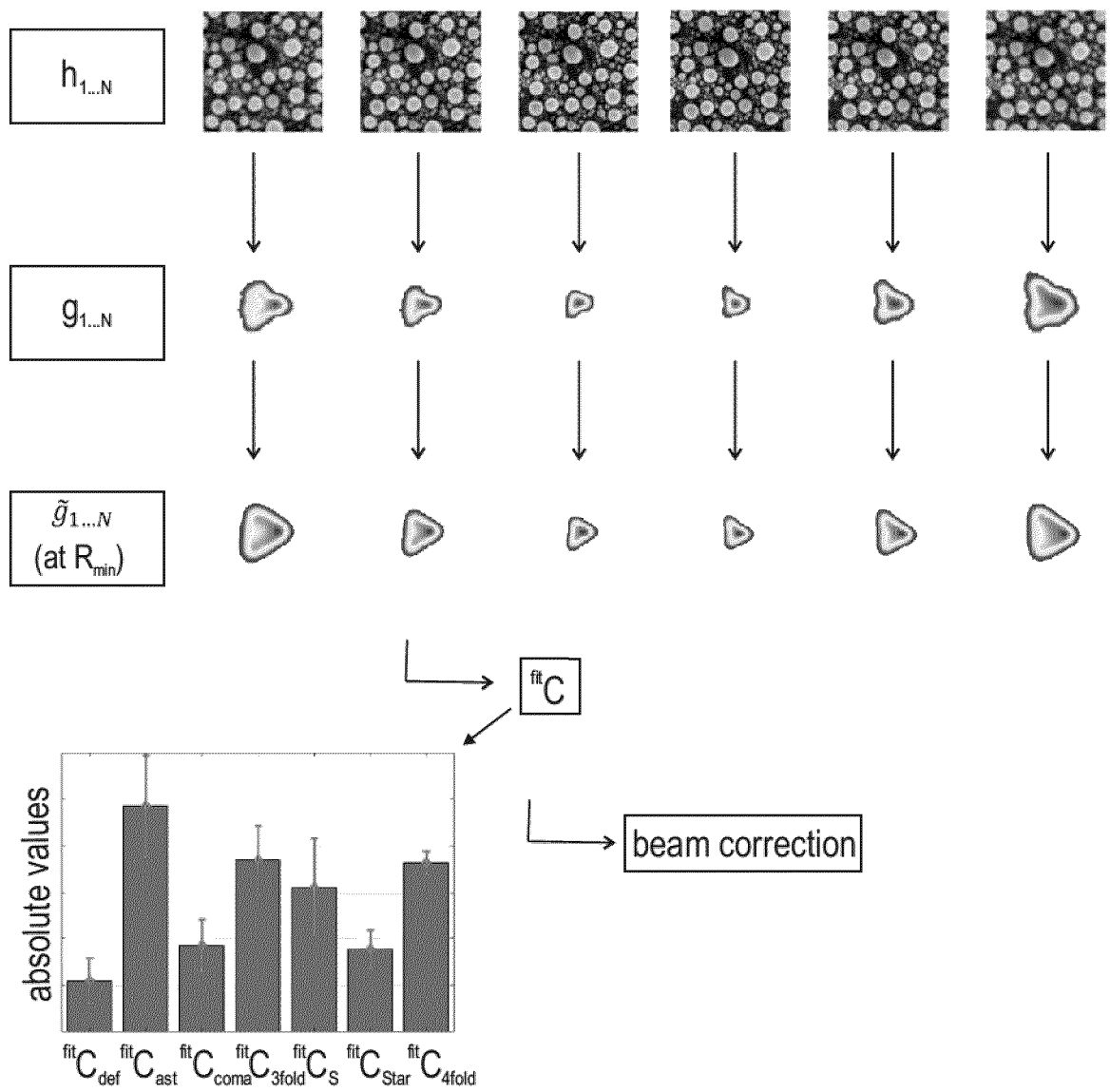
FIG. 6 is a flow diagram that illustrates the variant method of determining aberrations of a charged particle beam.

The beam cross sections in box 420 can be simulated for each defocus setting based on a set of beam aberration coefficients $^iC$. Optionally, also a focus beam cross section ($\tilde{g}_f$), i.e. the beam cross section in the focal plane, can be simulated, can be Fourier transformed to provide ($\tilde{G}_f$), and can then be provided for the calculation of the one or more retrieved beam cross sections ($G_{1...N}$) in box 430, as is schematically illustrated in FIG. 6.

An initial set of beam aberration coefficients $^1C$ may be used for an initial simulation of the one or more simulated beam cross sections ($\tilde{g}_{1...N}$) in box 420. The initial set of beam aberration coefficients $^1C$ may be an initial estimation, e.g., based on experience, based on an aberration estimation process known in the art, and/or based on knowledge of the beam-optical components of the system. Alternatively, some or all beam aberration coefficients may be set to zero in the initial set of beam aberration coefficients $^1C$. The input data for the simulation in box 420 may include the defocus settings previously used for the taken images and an initial or an updated set of beam aberration coefficients $^iC/^{i+1}C$.

In box 430, the one or more retrieved beam cross sections ($g_{1...N}$) and the one or more simulated beam cross sections ($\tilde{g}_{1...N}$) are compared for determining a magnitude ($R_i$) of a difference between the one or more retrieved beam cross sections ($g_{1...N}$) and the one or more simulated beam cross sections ($\tilde{g}_{1...N}$). As is schematically depicted in FIG. 4 and FIG. 5, the one or more retrieved beam cross sections ($g_{1...N}$) and the one or more simulated beam cross sections ($\tilde{g}_{1...N}$) can be compared to each other in real space, i.e. by comparing ($g_{1...N}$) and ($\tilde{g}_{1...N}$). For that purpose, the one or more retrieved beam cross sections in Fourier space ($\tilde{G}_{1...N}$) may be inversely Fourier transformed to provide the one or more retrieved beam cross section in real space ($\tilde{g}_{1...N}$) to be used in the comparison. Retrieved beam cross sections and simulated beam cross sections can be superimposed more easily than respective images, such that the comparison can be conducted in real space. Alternatively, even if not shown in the figures, it is also possible to compare the one or more retrieved beam cross sections in Fourier space ($G_{1...N}$) with the one or more simulated beam cross sections in Fourier space ($\tilde{G}_{1...N}$).

Comparing in box 430 may include calculating a difference value between each retrieved beam cross section ($g_n$) and the corresponding simulated beam cross section ($\tilde{g}_n$), and summarizing said difference values to obtain the magnitude ($R_i$), in particular in real space. In particular, in some embodiments, the magnitude ($R_i$) can be calculated as follows from the one or more retrieved beam cross sections ($g_{1...N}$) and the one or more simulated beam cross sections ($\tilde{g}_{1...N}$) simulated with the set of beam aberration coefficients $^iC$:

$$i \rightarrow \left( \sum_{n=1}^{N} \left( |g_n| - |\tilde{g}_n| \right)^2 \right) = R_i$$

If the initial set of beam aberration coefficients $^1C$ is used in the simulation, the magnitude $R_1$ is calculated. In subsequent iterations, updated sets of beam aberration coefficients $^{i+1}C$ are respectively used and $(R_{i+1})$ is calculated, with the objective to determine a set of beam aberration coefficients that leads to a minimized magnitude $(R_{min})$.

After calculating $(R_i)$, the set of beam aberration coefficients $^iC$ is varied to provide an updated set of beam aberration coefficients $^{i+1}C$, and the simulation in box 420 and the comparison in box 430 are repeated using the updated set of beam aberration coefficients $^{i+1}C$ in an iterative process. Specifically, one or more updated simulated beam cross sections are then calculated based on the updated set of beam aberration coefficients $^{i+1}C$ in box 420, and the one or more retrieved beam cross sections ($g_{1...N}$) are compared with the one or more updated simulated images in box 430, with the objective of minimizing the magnitude $(R_i)$ in an iterative simulation and comparison process.

In particular, the simulation in box 420, the comparison in box 430, and the variation of $^iC$ to provide $^{i+1}C$ may be repeated in an iterative process, until a minimized magnitude $(R_{min})$ of the difference between the one or more retrieved beam cross sections and the one or more simulated beam cross sections is obtained, and the respective updated set of beam aberration coefficients at the respective iteration constitutes an actual beam aberration $^{fit}C$. Specifically, as is schematically illustrated by box 240 in FIG. 4 and FIG. 5, after each iteration, it may be checked whether $(R_i = R_{min})$. If $(R_i = R_{min})$, the iterative process may end, and $^iC$ may be considered as the actual beam aberration $^{fit}C$. Otherwise, the next iteration may follow.

Optionally, the beam aberration $^{fit}C$ may then be partially or entirely corrected with one or more beam aberration correctors, to provide a corrected charged particle beam. For further details and other optional features, reference is made to the above explanations with respect to FIG. 2 and FIG. 3, that are not repeated here.

The variant determination method shown in FIG. 4 and FIG. 5 allows for obtaining absolute values of beam aberration coefficients of a charged particle beam in a charged particle beam system, which is different from other estimation methods which allow only for relative estimates of beam aberration coefficients. Goodness-of-fit routines in the processing unit can provide a confidence level of the accuracy of the obtained aberration coefficients $^{fit}C$, which has not been possible previously.

FIG. 6 is a flow diagram that illustrates the variant method of determining aberrations of a charged particle beam described herein. First, a plurality of images ($h_{1...N}$) (six images in FIG. 6) are taken at a plurality of different defocus distances $z_{1...N}$ (three images in overfocus and three images in underfocus in FIG. 6). A plurality of beam cross sections ($g_{1...N}$) at the respective defocus distances are retrieved from the plurality of images ($h_{1...N}$). Further, a plurality of beam cross sections ($\tilde{g}_{1...N}$) (six simulated beam cross sections in FIG. 6) are iteratively simulated at the plurality of different defocus distances based on an initial set of beam aberrations and then on respective updated sets of beam aberration coefficients, until a comparison between the plurality of retrieved beam cross sections ($g_{1...N}$) and the plurality of simulated beam cross sections ($\tilde{g}_{1...N}$) yields a minimum, which means that the plurality of simulated beam cross sections ($\tilde{g}_{1...N}$) comes close to the plurality of retrieved beam cross sections ($g_{1...N}$), i.e. the respective set of beam aberration coefficients comes close to the actual set of beam aberration coefficients. The respective set of beam aberration coefficients at the respective iteration can then be used as input parameters to one or more aberration correctors, for providing an aberration-corrected charged particle beam.

Specifically, the following embodiments are described herein:

Embodiment 1: A method of determining aberrations of a charged particle beam (11) focused by a focusing lens (120) toward a sample (10) in a charged particle beam system (100), comprising: (a) taking one or more images of the sample at one or more defocus settings to provide one or more taken images ($h_{1...N}$); (b) simulating one or more images of the sample taken at the one or more defocus settings based on a set of beam aberration coefficients ($^iC$) and a focus image ($h_f$) of the sample, to provide one or more simulated images ($\tilde{h}_{1...N}$); (c) comparing the one or more taken images and the one or more simulated images for determining a magnitude ($R_i$) of a difference therebetween; and (d) varying the set of beam aberration coefficients ($^iC$) to provide an updated set of beam aberration coefficients ($^{i+1}C$) and repeating (b) and (c) using the updated set of beam aberration coefficients ($^{i+1}C$) in an iterative process for minimizing said magnitude ($R_i$).

Embodiment 2: The method according to embodiment 1, wherein the one or more defocus settings comprises one or more defocus distances ($Z_{1...N}$) of the sample (10) from a respective beam focus of the charged particle beam, such that, in (a), the one or more images are taken when the sample is arranged at the one or more defocus distances ($z_{1...N}$), and, in (b), the one or more simulated images comprise simulated images of the sample taken at the one or more defocus distances ($z_{1...N}$).

Embodiment 3: The method according to embodiment 1 or 2, wherein, in (a), a plurality of six or more images is taken at six or more different defocus distances, particularly by varying a focusing strength of the focusing lens in predetermined increments or by moving a sample stage relative to the focusing lens in predetermined increments.

Embodiment 4: The method according to embodiment 3, wherein the one or more taken images comprise at least one or more images taken at an overfocus distance and at least one or more images taken at an underfocus distance.

Embodiment 5: The method according to any of embodiments 1 to 4, wherein the one or more defocus settings comprise one or more beam landing energies ($E_{1...N}$) of the charged particle beam varied from a focus beam landing energy, such that, in (a), the one or more taken images are taken at the one or more beam landing energies, and, in (b), the one or more simulated images comprise simulated images of the sample taken at the one or more beam landing energies. In particular, the one or more defocus settings comprise a plurality of different beam landing energies of the charged particle beam impinging on the sample. In some embodiments, the one or more defocus settings comprise different defocus distances and different beam landing energies.

Embodiment 6: The method according to any of embodiments 1 to 5, wherein (b) and (c) are repeated until a minimized magnitude ($R_{min}$) of the difference between the one or more taken images and the one or more simulated images is obtained, and the updated set of beam aberration coefficients ($^{i+1}C$) at the respective iteration constitutes an actual beam aberration ($^{fit}C$), particularly in absolute values.

Embodiment 7: The method according to embodiment 6, further comprising correcting the actual beam aberration ($^{fit}C$) with one or more aberration correctors, particularly with one or more electrostatic or magnetic multipole correctors, to provide a corrected charged particle beam.

Embodiment 8: The method according to any of embodiments 1 to 7, wherein, in (c), the one or more taken images and the one or more simulated images are compared in Fourier space, or alternatively in real space.

Embodiment 9: The method according to any of embodiments 1 to 8, wherein, in (c), comparing comprises calculating a difference value between each image of the one or more taken images and the corresponding simulated image of the one or more simulated images, and summarizing said difference values to obtain the magnitude ($R_i$), in particular wherein said calculation is done in Fourier space.

Embodiment 10: The method according to any of embodiments 1 to 9, wherein, in (b), simulating comprises, at each defocus setting of the one or more defocus settings, calculating a beam cross section of the charged particle beam based on the set of beam aberration coefficients ($^iC$), and calculating a respective simulated image in Fourier space based on a product of the beam cross section in Fourier space and the focus image in Fourier space.

Embodiment 11: The method according to embodiment 10, wherein calculating the respective simulated image in Fourier space further comprises a division by a focus beam cross section in Fourier space.

Embodiment 12: A method of determining aberrations of a charged particle beam (11) focused by a focusing lens (120) toward a sample (10) in a charged particle beam system (100), comprising: (a) taking one or more images of the sample at one or more defocus settings to provide one or more taken images, and retrieving one or more retrieved beam cross sections from the one or more taken images; (b) simulating one or more beam cross sections at the one or more defocus settings based on a set of beam aberration coefficients ($^iC$), to provide one or more simulated beam cross sections; (c) comparing the one or more retrieved beam cross sections and the one or more simulated beam cross sections for determining a magnitude (Ri) of a difference therebetween; and (d) varying the set of beam aberration coefficients ($^iC$) to provide an updated set of beam aberration coefficients ($^{i+1}C$) and repeating (b) and (c) using the updated set of beam aberration coefficients ($^{i+1}C$) in an iterative process for minimizing said magnitude ($R_i$).

Embodiment 13: The method according to embodiment 12, wherein the one or more defocus settings comprise one or more defocus distances ($z_{1...N}$) of the sample (10) from a respective beam focus of the charged particle beam, such that, in (a), the one or more images are taken at the one or more defocus distances ($Z_{1...N}$),and, in (b), the one or more beam cross sections are simulated at the one or more defocus distances ($Z_{1...N}$).

Embodiment 14: The method according to embodiment 12 or 13, wherein, in (a), a plurality of six or more images is taken at six or more different defocus distances, particularly by varying a focusing strength of the focusing lens in predetermined increments or by moving a sample stage relative to the focusing lens in predetermined increments.

Embodiment 15: The method according to embodiment 14, wherein the plurality of taken images comprises at least one image taken at an overfocus distance and at least one image taken at an underfocus distance.

Embodiment 16: The method according to any of embodiments 12 to 15, wherein the one or more defocus settings comprise one or more beam landing energies ($E_{1...N}$) of the charged particle beam varied from a focus beam landing energy, such that, in (a), the one or more images are taken at the one or more beam landing energies, and, in (b), the one or more beam cross sections are simulated at the one or more beam landing energies ($E_{1...N}$). In particular, the one or more defocus settings comprise a plurality of beam landing energies, such as one or more beam energies above the focus beam landing energy and one or more beam energies below the focus beam landing energy.

Embodiment 17: The method according to any of embodiments 12 to 16, wherein (b) and (c) are repeated until a minimized magnitude ($R_{min}$) of the difference between the one or more retrieved beam cross sections and the one or more simulated beam cross sections is obtained, and the updated set of beam aberration coefficients ($^{i+1}C$) at the respective iteration constitutes an actual beam aberration ($^{fit}C$) in absolute values.

Embodiment 18: The method according to embodiment 17, further comprising correcting the actual beam aberration ($^{fit}C$) with one or more aberration correctors, particularly with one or more electrostatic or magnetic multipole correctors, to provide a corrected charged particle beam.

Embodiment 19: The method according to any of embodiments 12 to 18, wherein, in (c), the one or more taken images and the one or more simulated images are compared in real space, or alternatively in Fourier space.

Embodiment 20: The method according to any of embodiments 12 to 19, wherein, in (c), comparing comprises calculating a difference value between each retrieved beam cross section and the corresponding simulated beam cross section, and summarizing said difference values to obtain the magnitude ($R_i$), in particular in real space, or alternatively in Fourier space.

Embodiment 21: The method according to any of embodiments 12 to 20, wherein, in (c), retrieving the one or more retrieved beam cross sections from the one or more taken images comprises dividing the one or more taken images in Fourier space by a focus image of the sample in Fourier space.

Embodiment 22: The method according to embodiment 21, wherein retrieving the one or more retrieved beam cross sections from the one or more taken images further comprises at least one of a multiplication with an adaptive filter term $G_{1...N}^{filter}$ and a multiplication with a focus beam cross section in Fourier space.

Embodiment 23: The method according to any of embodiments 1 to 22, wherein, in (d), the beam aberration coefficients of the set of beam aberration coefficients are varied subsequently and/or in parallel, until a minimized magnitude ($R_{min}$) as a function of all beam aberration coefficients of the set of beam aberration coefficients is obtained, in particular based on a multi-dimensional variation routine. For example, a first beam aberration coefficient of the set of beam aberration coefficients ($^iC$) may be varied until a minimum of the magnitude (Ri) as a function of the first beam aberration coefficient is obtained, whereupon a next beam aberration coefficient of the set of beam aberration coefficients ($^iC$) can be varied until a minimum of the magnitude (Ri) as a function of the next beam aberration coefficient is obtained, etc. Alternatively, several beam aberration coefficients may be varied in parallel.

Embodiment 24: The method according to any of embodiments 1 to 23, wherein taking the one or more images of the sample comprises taking one or more images of the sample at one or more underfocus distances and taking one or more images of the sample at one or more overfocus distances.

Embodiment 25: The method according to any of embodiments 1 to 24, wherein taking the one or more images of the sample comprises taking a plurality of images of the sample at a plurality of different defocus distances, particularly by varying a focusing strength of the focusing lens in predetermined increments, or alternatively by varying a distance between the focusing lens and the sample in predetermined increments, particularly in equal increments of, e.g. 0.1 µm or more and 2 µm or less, respectively.

Embodiment 26: The method according to any of embodiments 1 to 25, wherein the set of beam aberration coefficients ($^iC$) includes two, three or more coefficients of the group consisting of $^iC_s$, $^iC$defocus, $^iC_{astigmatism,\ 2\text{-}fold}$, $^iC_{astigmatism,\ 3\text{-}fold}$, $^iC_{astigimtism,\ 4\text{-}fold}$, $^iC_{star}$, $^iC_{coma}$, and one, two or more chromatic aberration coefficients.

The methods according to the above embodiments may be conducted by any of the charged particle beam systems described herein.

Embodiment 26: A charged particle beam system for inspecting and/or imaging a sample, comprising: a charged particle source 105 for emitting a charged particle beam 11 propagating along an optical axis; a sample stage 108; a focusing lens 120 for focusing the charged particle beam toward a sample 10 placed on the sample stage; a charged particle detector 118 for detecting signal particles emitted from the sample; and a processor and a memory storing instructions that, when executed by the processor, cause the system to perform the method according to any of the above embodiments.

Embodiment 27: A charged particle beam system for inspecting and/or imaging a sample, comprising: a charged particle source for emitting a charged particle beam propagating along an optical axis; a sample stage; a focusing lens for focusing the charged particle beam toward a sample placed on the sample stage; a charged particle detector for detecting signal particles emitted from the sample; and a processor and a memory storing instructions that, when executed by the processor, cause the system: (x1) to simulate one or more images of the sample when taken at one or more defocus settings based on a set of beam aberration coefficients ($^iC$) and a focus image of the sample, to provide one or more simulated images; (x2) to compare one or more taken images of the sample taken at the one or more defocus settings and the one or more simulated images for determining a magnitude (Ri) of a difference therebetween; and (x3) to vary the set of beam aberration coefficients ($^iC$) to provide an updated set of beam aberration coefficients ($^{i+1}C$), and to use the updated set of beam aberration coefficients ($^{i+1}C$) in a subsequent iteration of (x1) and (x2) for minimizing said magnitude ($R_i$).

Embodiment 28: A charged particle beam system for inspecting and/or imaging a sample, comprising: a charged particle source for emitting a charged particle beam propagating along an optical axis; a sample stage; a focusing lens for focusing the charged particle beam toward a sample placed on the sample stage; a charged particle detector for detecting signal particles emitted from the sample; and a processor and a memory storing instructions that, when executed by the processor, cause the system: (x1) to simulate one or more beam cross sections at one or more defocus settings based on a set of beam aberration coefficients ($^iC$), to provide one or more simulated beam cross sections; (x2) to compare one or more retrieved beam cross sections retrieved from one or more taken images ($h_{1...N}$) of the sample taken at the one or more defocus settings and the one or more simulated beam cross sections for determining a magnitude (Ri) of a difference therebetween; and (x3) to vary the set of beam aberration coefficients ($^iC$) to provide an updated set of beam aberration coefficients ($^{i+1}C$), and to use the updated set of beam aberration coefficients ($^{i+1}C$) in a subsequent iteration of (x1) and (x2) for minimizing said magnitude ($R_i$).

Embodiment 29: The charged particle beam system according to embodiment 27 or 28, wherein the one or more defocus settings comprise one or more defocus distances of the sample from a respective beam focus of the charged particle beam, when the one or more images are taken and simulated, particularly a plurality of different defocus distances.

Embodiment 30: The charged particle beam system according to any of embodiments 27 to 29, wherein the one or more defocus settings comprise one or more beam landing energies of the charged particle beam varied from a focus beam landing energy, when the one or more images are taken and simulated, particularly a plurality of different beam landing energies.

Embodiment 31: The charged particle beam system according to any of embodiments 27 to 30, further comprising an image generation unit for generating the one or more taken images of the sample at the one or more defocus settings, for forwarding information on the one or more defocus settings for the simulation in (x1) and for forwarding the one or more taken image for the comparison in (x2).

The charged particle beam systems described herein may be configured to be operated according to any of the methods described herein.

While the foregoing is directed to embodiments, other and further embodiments may be devised without departing from the basic scope thereof, and the scope thereof is determined by the claims that follow.

The invention claimed is:
1. A method of determining aberrations of a charged particle beam focused by a focusing lens toward a sample in a charged particle beam system, comprising:
   (a) taking one or more images of the sample at one or more defocus settings to provide one or more taken images;
   (b) simulating one or more images of the sample taken at the one or more defocus settings based on a set of beam aberration coefficients ($^iC$) and a focus image of the sample, to provide one or more simulated images;
   (c) comparing the one or more taken images and the one or more simulated images for determining a magnitude (R) of a difference therebetween; and
   (d) varying the set of beam aberration coefficients ($^iC$) to provide an updated set of beam aberration coefficients ($^{i+1}C$) and repeating (b) and (c) using the updated set of beam aberration coefficients ($^{i+1}C$) in an iterative process for minimizing said magnitude (R).

2. The method of claim 1, wherein the one or more defocus settings comprises one or more defocus distances of the sample from a respective beam focus of the charged particle beam, such that, in (a), the one or more images are taken when the sample is arranged at the one or more defocus distances, and, in (b), the one or more simulated images comprise simulated images of the sample taken at the one or more defocus distances.

3. The method of claim 2, wherein, in (a) a plurality of six or more images is taken at six or more different defocus distances, particularly by varying a focusing strength of the focusing lens or by moving a sample stage relative to the focusing lens.

4. The method of claim 1, wherein the one or more defocus settings comprise one or more beam landing energies of the charged particle beam varied from a focus beam landing energy, such that, in (a), the one or more taken images are taken at the one or more beam landing energies, and, in (b), the one or more simulated images comprise simulated images of the sample taken at the one or more beam landing energies.

5. The method of claim 1, wherein (b) and (c) are repeated until a minimized magnitude ($R_{min}$) of the difference between the one or more taken images ($h_{1...N}$) and the one or more simulated images is obtained, and the updated set of beam aberration coefficients ($^{i+1}C$) at the respective iteration constitutes an actual beam aberration ($^{fit}C$).

6. The method of claim 5, further comprising correcting the actual beam aberration ($^{fit}C$) with one or more aberration correctors, particularly with one or more electrostatic or magnetic multipole correctors, to provide a corrected charged particle beam.

7. The method of claim 1, wherein, in (c), the one or more taken images and the one or more simulated images are compared in Fourier space.

8. The method of claim 1, wherein, in (c), comparing comprises calculating a difference value between each image of the one or more taken images and the corresponding simulated image of the one or more simulated images, and summarizing said difference values to obtain the magnitude (R), in particular in Fourier space.

9. The method of claim 1, wherein, in (b), simulating comprises, at each defocus setting of the one or more defocus settings,
calculating a beam cross section of the charged particle beam based on the set of beam aberration coefficients ($^iC$), and
calculating a respective simulated image in Fourier space based on a product of the beam cross section in Fourier space and the focus image in Fourier space, or calculating a respective simulated image in real space based on a convolution.

10. The method of claim 9, wherein calculating the respective simulated image in Fourier space further comprises a division by a focus beam cross section in Fourier space.

11. The method of claim 1, wherein the set of beam aberration coefficients ($^iC$) includes two, three or more coefficients of the group consisting of $^iC_s$, $^iC_{defocus}$, $^iC_{astigmatism, 2-fold}$, $^iC_{astigmatism, 3-fold}$, $^iC_{astigmatism, 4-fold}$, $^iC_{star}$, and $^iC_{coma}$, and one, two or more chromatic aberration coefficients.

12. A charged particle beam system, comprising:
a charged particle source for emitting a charged particle beam propagating along an optical axis;
a sample stage;
a focusing lens for focusing the charged particle beam toward a sample placed on the sample stage;
a charged particle detector for detecting signal particles emitted from the sample; and
a processor and a memory storing instructions that, when executed by the processor, cause the charged particle beam system to perform the method of claim 1.

13. A method of determining aberrations of a charged particle beam focused by a focusing lens toward a sample in a charged particle beam system, comprising:
(a) taking one or more images of the sample at one or more defocus settings, to provide one or more taken images, and retrieving one or more retrieved beam cross sections from the one or more taken images;
(b) simulating one or more beam cross sections at the one or more defocus settings based on a set of beam aberration coefficients ($^iC$), to provide one or more simulated beam cross sections;
(c) comparing the one or more retrieved beam cross sections and the one or more simulated beam cross sections for determining a magnitude (R) of a difference therebetween; and
(d) varying the set of beam aberration coefficients ($^iC$) to provide an updated set of beam aberration coefficients ($^{i+1}C$) and repeating (b) and (c) using the updated set of beam aberration coefficients ($^{i+1}C$) in an iterative process for minimizing said magnitude (R).

14. The method of claim 13, wherein the one or more defocus settings comprises one or more defocus distances of the sample from a respective beam focus of the charged particle beam, or wherein the one or more defocus settings comprises one or more beam landing energies of the charged particle beam varied from a focus beam landing energy.

15. The method of claim 13, wherein (b) and (c) are repeated until a minimized magnitude ($R_{min}$) of the difference between the one or more retrieved beam cross sections and the one or more simulated beam cross sections is obtained, and the updated set of beam aberration coefficients ($^{i+1}C$) at the respective iteration constitutes an actual beam aberration ($^{fit}C$) in absolute values.

16. The method of claim 13, wherein, in (c), the one or more retrieved beam cross sections and the one or more simulated beam cross sections are compared in real space.

17. The method of claim 13, wherein, in (c), comparing comprises calculating a difference value between each retrieved beam cross section and the corresponding simulated beam cross section, and summarizing said difference values to obtain the magnitude (R), in particular in real space.

18. The method of claim 13, wherein, in (a), retrieving the one or more retrieved beam cross sections from the one or more taken images comprises dividing the one or more taken images in Fourier space by a focus image of the sample in Fourier space, or wherein the one or more retrieved beam cross sections are retrieved based on a deconvolution in real space.

19. The method of claim 18, wherein retrieving the one or more retrieved beam cross sections from the one or more taken images further comprises at least one of an application of an adaptive filter term and a multiplication with a focus beam cross section in Fourier space.

20. The method of claim 13, wherein, in (d), beam aberration coefficients of the set of beam aberration coefficients are varied subsequently and/or in parallel, until a minimized magnitude ($R_{min}$) as a function of all beam aberration coefficients of the set of beam aberration coefficients is obtained, in particular based on a multi-dimensional variation routine.

21. A charged particle beam system, comprising:
a charged particle source for emitting a charged particle beam propagating along an optical axis;
a sample stage;
a focusing lens for focusing the charged particle beam toward a sample placed on the sample stage;
a charged particle detector for detecting signal particles emitted from the sample; and
a processor and a memory storing instructions that, when executed by the processor, cause the charged particle beam system
(x1) to simulate one or more images of the sample at one or more defocus settings based on a set of beam aberration coefficients ($^iC$) and a focus image of the sample, to provide one or more simulated images, or to simulate one or more beam cross sections at one or more defocus settings based on a set of beam aberration coefficients ($^{i}C$), to provide one or more simulated beam cross sections;

(x2) to compare one or more taken images of the sample taken at the one or more defocus settings and the one or more simulated images for determining a magnitude of a difference therebetween, or to compare one or more retrieved beam cross sections retrieved from one or more taken images of the sample taken at the one or more defocus settings and the one or more simulated beam cross section for determining a magnitude of a difference therebetween; and (x3) to vary the set of beam aberration coefficients ($^{i}C$) to provide an updated set of beam aberration coefficients ($^{i+1}C$), and to use the updated set of beam aberration coefficients ($^{i+1}C$) in a subsequent iteration of (x1) and (x2) for minimizing said magnitude.

* * * * *